(12) United States Patent
Seils et al.

(10) Patent No.: US 6,850,034 B2
(45) Date of Patent: Feb. 1, 2005

(54) CIRCUIT ARRANGEMENT FOR MONITORING THE STATE OF CHARGE OF AN ACCUMMULATOR

(75) Inventors: Wolfgang Seils, Ludwigsburg (DE); Eberhard Schoch, Stuttgart (DE); Martin Brand, Ludwigsburg (DE); Juergen Schoettle, Moeglingen (DE); Christoph Wenger, Korntal-Muenchingen (DE); Clemens Schmucker, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/344,463

(22) PCT Filed: Aug. 10, 2001

(86) PCT No.: PCT/DE01/03082
§ 371 (c)(1),
(2), (4) Date: Sep. 29, 2003

(87) PCT Pub. No.: WO02/14887
PCT Pub. Date: Feb. 21, 2002

(65) Prior Publication Data
US 2004/0056634 A1 Mar. 25, 2004

(30) Foreign Application Priority Data
Aug. 12, 2000 (DE) .......................................... 100 39 472

(51) Int. Cl.$^7$ ................................................ H02J 7/00
(52) U.S. Cl. ..................................................... 320/104
(58) Field of Search ................................ 320/104, 116, 320/132, 134, 149; 429/92, 93, 98; 324/428; 701/29, 33, 36, 31, 32

(56) References Cited

U.S. PATENT DOCUMENTS

| | | | | |
|---|---|---|---|---|
| 4,965,550 A | | 10/1990 | Wroblewski | ................ 340/524 |
| 5,057,383 A | * | 10/1991 | Sokira | ................ 429/92 |
| 5,438,252 A | * | 8/1995 | Perelle | ................ 320/149 |
| 5,444,378 A | | 8/1995 | Rogers | ................ 324/428 |
| 5,557,188 A | * | 9/1996 | Piercey | ................ 320/134 |
| 5,686,815 A | * | 11/1997 | Reipur et al. | ................ 320/116 |
| 5,710,501 A | | 1/1998 | Zeising et al. | ................ 307/150 |
| 5,965,997 A | | 10/1999 | Alwardi et al. | ................ 320/132 |
| 6,198,995 B1 | * | 3/2001 | Settles et al. | ................ 701/29 |

FOREIGN PATENT DOCUMENTS

| | | |
|---|---|---|
| DE | 41 23 811 | 1/1993 |
| EP | 0 448 767 | 10/1991 |
| EP | 0 665 628 | 8/1995 |
| JP | 11 283677 | 1/2000 |
| WO | WO 99 01773 | 1/1999 |
| WO | WO 99/50098 | 10/1999 |

* cited by examiner

*Primary Examiner*—Pia Tibbits
(74) *Attorney, Agent, or Firm*—Kenyon & Kenyon

(57) ABSTRACT

A circuit configuration for monitoring the state of charge of an accumulator battery, which is installed in particular in a motor vehicle, has a control unit that records and evaluates the flow of current out of or into the accumulator battery. The control unit is able to be shifted into a state with low current consumption (sleep mode), out of which it may be brought again by an activation signal. Moreover, a sensor is provided that emits a signal in response to a flow of current out of or into the accumulator battery.

5 Claims, 2 Drawing Sheets

CIRCUIT ARRANGEMENT FOR MONITORING THE STATE OF CHARGE OF AN ACCUMMULATOR

FIELD OF THE INVENTION

The present invention relates to a circuit configuration for monitoring the state of charge of an accumulator battery, which is disposed in particular in a motor vehicle, having a control unit that records and evaluates the flow of current out of or into the accumulator battery.

BACKGROUND INFORMATION

A circuit configuration of this type is used, for example, in motor vehicles, to thereby continually have available the instantaneous state of charge of the accumulator battery. By recording the accumulator current, the accumulator voltage and the accumulator temperature, relatively reliable information can be ascertained about the state of the accumulator battery. The indicated quantities are acquired and the state of the accumulator battery is ascertained by the control unit.

Since the control unit is supplied with energy from the accumulator battery, when the engine is at rest and therefore electrical energy is not being produced by the generator installed in a motor vehicle, the control unit discharges the accumulator battery. To prevent this, the control unit is switched off when the motor vehicle is in the rest state. As soon as the ignition is switched off and the current consumption in the motor vehicle has fallen sufficiently, the control unit stores the instantaneous state of the accumulator battery and then switches itself off. The control unit is only switched on again when the ignition is switched on.

Since, however, in today's motor vehicles there are frequently consumers which require energy even in the rest state of the motor vehicle, such as, for example, an ice maker in the trunk of the motor vehicle, current is drawn from the accumulator battery without this being registered by the control unit. Because of this, the state of the accumulator battery ascertained by the control unit no longer agrees with the true state of the accumulator battery.

It may be that it is known from PCT International Patent Publication No. WO 99/50098 to shift a motor vehicle into a rest state (sleep mode) to thereby reduce the energy consumption; however, no indication can be gathered from the cited document to monitor the state of charge of an accumulator battery. The indicated publication deals with a monitoring system of a motor vehicle which has inputs for a plurality of vehicle subsystems. To save on energy, the cited document proposes shifting the motor vehicle into a sleep mode, activation signals (wake-up signals) normally not being given to the inputs of the vehicle subsystems.

During the sleep mode, the inputs are permanently polled to thereby detect the appearance of a wake-up signal. If no wake-up signal appears after a certain time, the cycle time of the polling inputs is increased. If a wake-up signal still does not appear at the inputs after a further predetermined time, the cycle time is increased once more. The intention is to thereby reduce the energy consumption during the sleep mode.

Moreover, German Patent No. 41 23 811 A1 describes a method for operating a microprocessor, in which the microprocessor may be switched from an inactive to an active operating state by an activation signal at an interrupt input. After each entrance into the inactive state, the activation signal is supplied to the interrupt input after a specifiable time.

Furthermore, U.S. Pat. No. 4,965,550 describes a circuit configuration for continually monitoring the status of a plurality of switches and so-called intelligent sensors (smart sensors), which are connected to the switches. Each sensor is connected to a separate single point in a single-wire bus, a smart-sensor multiplex configuration that represents a wake-up circuit acting on the sensor. The wake-up circuit permits the activation of any switch of a group of switches having a high priority, in order to shift a microcontroller automatically from a waiting state into an active state. In the active state, all circuits of the entire system are supplied with energy, whereupon all switches and sensor modules are polled.

It is an object of the present invention to provide a circuit configuration of the type indicated at the outset in such a way that accuracy in recording the state of charge of an accumulator battery is increased.

SUMMARY OF THE INVENTION

According to the present invention, in a circuit configuration for monitoring the state of charge of an accumulator battery, which in particular is installed in a motor vehicle and has a control unit that records and evaluates the flow of current out of or into the accumulator battery, the control unit is able to be shifted into a state with low current consumption (sleep mode), out of which it may be brought again by an activation signal; and a sensor is provided which emits a signal in response to a flow of current out of or into the accumulator battery.

Because the control unit is able to be shifted into a state with low current consumption, the control unit may remain switched on permanently without the state of charge of the accumulator battery thereby noticeably changing. Since the control unit is able to be brought out of the state with low current consumption again by an activation signal, it can be shifted in a simple manner into the active state again. Due to the sensor, which emits a signal in response to a flow of current out of or into the accumulator battery, the control unit can thus always be easily shifted into the active state when the state of charge of the accumulator battery changes because of a flow of current out of or into the accumulator battery.

Therefore, the circuit configuration of the present invention ensures that the control unit records a change in the charge state of the accumulator battery at any time, without its being permanently in the active state. Shifting the control unit into the state with low current consumption during the rest state of the motor vehicle advantageously prevents the charge state of the accumulator battery from changing noticeably due to the draw of energy by the control unit. By the use of a sensor that emits a signal in response to a flow of current in the lead of the accumulator battery, and because the control unit is brought out of the rest state by the sensor signal and shifted into the active state, an uninterrupted monitoring of the accumulator battery is possible without significant energy being needed for that purpose.

In a particularly advantageous manner, the primary winding of a transformer is connected in the lead of the accumulator battery, it being very advantageous if the primary winding is formed by the accumulator-battery lead itself. A flow of current in the lead of the accumulator battery may thereby be detected in a simple manner.

It is particularly advantageous if the transformer is a component of a compensation (balancing)-current sensor, by which the flow of current out of or into the accumulator battery is measured. Advantageously, for a specific embodiment of this type, almost no special outlay is necessary for generating the activation signal of the control unit. This has a very favorable effect on the costs. Moreover, as a rule, almost no energy is needed for generating the activation signal.

The indicated circuit configuration may be further improved, in that the sensor signal is initially given to a comparator.

In a simple manner, the signal emitted by the sensor may be converted by the comparator into a signal well-suited for further processing. Since a comparator may be implemented with little expenditure and is able to be integrated into an ASIC (application-specific IC), the costs of such a specific embodiment are very low. However, conventional comparators with integrated reference-voltage source, which are available on the market as an IC, could also be used. To reliably detect a sudden current variation in the lead of the accumulator battery, downstream of the comparator, a digital signal processing may be provided by which the signal-to-noise ratio of the circuit is increased.

DETAILED DESCRIPTION

Figure 1:
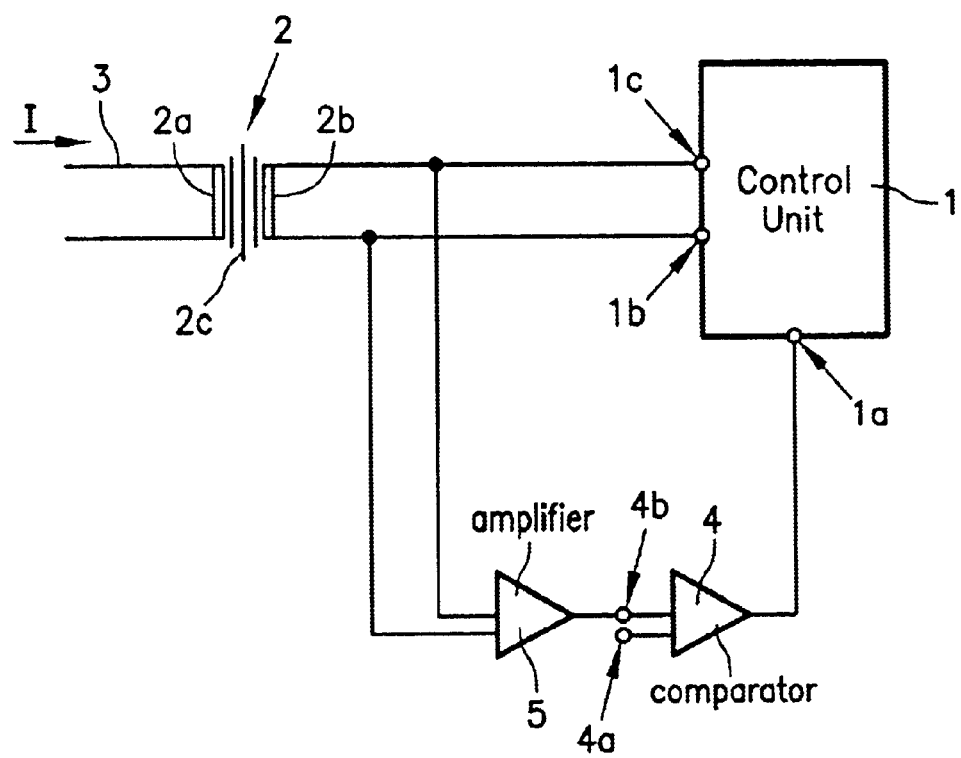
FIG. 1 shows a schematic representation of a circuit configuration according to the present invention.

As can be gathered from FIG. 1, a control unit 1 has an activation input 1a by which control unit 1 is able to be activated again from a state with low current consumption. Control unit 1 also has two signal inputs 1b, 1c by which the control unit is supplied with signals to be processed by it. In the inactive state of control-unit 1, signal inputs 1b, 1c are highly resistive.

The circuit configuration shown in FIG. 1 also has a transformer 2 having a transformer core 2c as well as a primary winding 2a and a secondary winding 2b. Primary winding 2a is disposed, for example, in lead 3 of a motor-vehicle accumulator battery.

The terminations of secondary winding 2b are run to an amplifier 5. The output of amplifier 5 is routed to signal input 4b of a comparator 4. A voltage corresponding to the desired operating point is applied at reference-voltage input 4a of comparator 4. The output of comparator 4 is routed to activation input 1a of control unit 1.

If no signal is applied to activation input 1a of control unit 1, control unit 1 goes into a state with low current consumption. In this state, signal inputs 1b, 1c are switched to be highly resistive. The current consumption of the circuit configuration is very low in this state.

If a current flows in line 3 to be monitored, and thus through primary winding 2a of transformer 2, a voltage is induced in secondary winding 2b of transformer 2. The induced voltage is amplified by amplifier 5 and arrives at signal input 4b of comparator 4. If the voltage from amplifier 5 applied at the input 4b of comparator 4 is greater than the voltage applied at reference-voltage input 4a of comparator 4, comparator 4 emits an output signal. Since the output signal of comparator 4 is applied to activation input 1a of control unit 1, control unit 1 is brought from the inactive state to the active state. It is thereby able to process the signal applied at signal inputs 1b, 1c.

Figure 2:
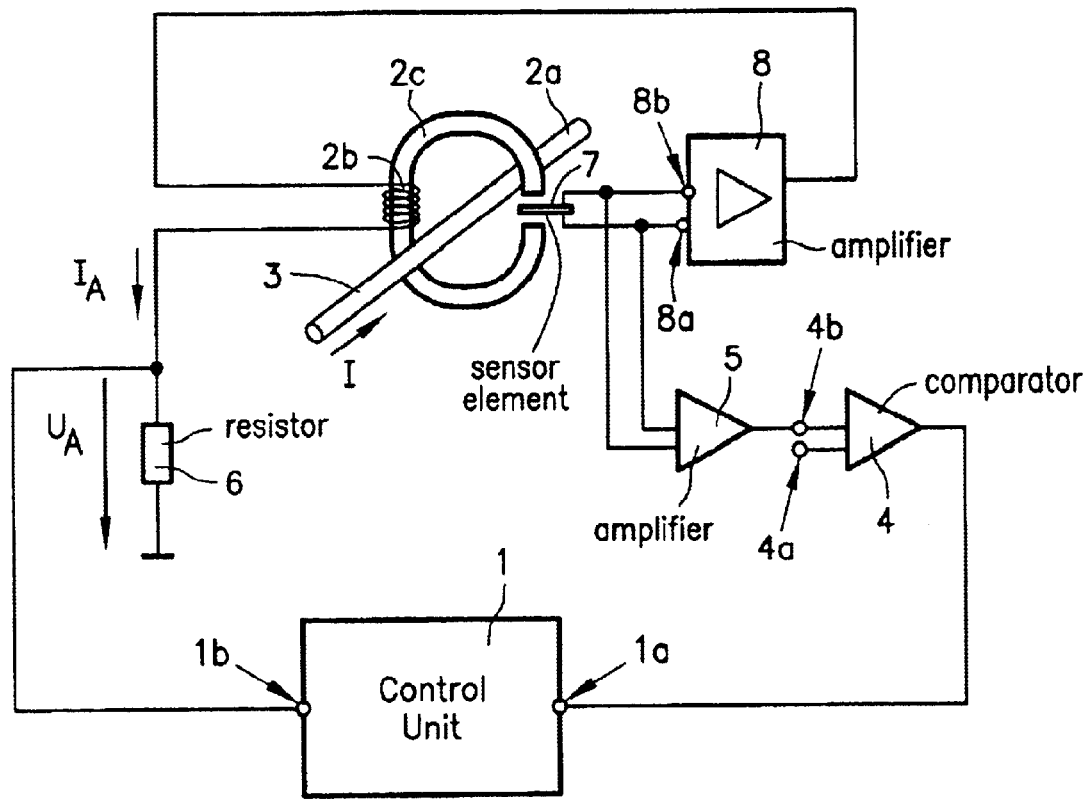
FIG. 2 shows the circuit configuration, depicted in FIG. 1, in conjunction with a compensation-current sensor.

The circuit configuration shown in FIG. 2 corresponds essentially to the circuit configuration shown in FIG. 1. Identical components are provided with the same reference numerals.

In the specific embodiment shown in FIG. 2, core 2c of transformer 2 is formed as an annular core having an air gap. Primary winding 2a of transformer 2 is formed by lead 3 of a motor-vehicle accumulator battery. Secondary winding 2b of transformer 2 is a coil 2b wound about annular core 2c. Disposed in the air gap of annular core 2c is a sensor element 7 for detecting the magnetic field strength in the air gap of annular core 2c. The signal outputs of sensor element 7 are routed to signal inputs 8a, 8b of a first amplifier 8. Output 8c of first amplifier 8 is connected to coil 2b and supplies it with current corresponding to the signal of sensor element 7. The current given off by first amplifier 8 is so great that the magnetic field strength in the air gap of annular core 2 is nearly zero.

The current flowing through coil 2b causes a voltage drop $U_A$ at a load resistor 6 connected in series with coil 2b. Thus, voltage drop $U_A$ is a measure for the current flowing through lead 3. To determine the current, voltage $U_A$ is given to input 1b of a control unit 1 in which the current flowing through lead 3 is recorded.

The outputs of sensor element 7 are also switched to the input of a second amplifier 5. The output of second amplifier 5 is connected to signal input 4b of comparator 4. At reference-voltage input 4a of comparator 4, a reference voltage is applied which forms the operating point of comparator 4. The output of comparator 4 is connected to activation input 1a of control unit 1.

If no signal is applied at activation input 1a of control unit 1, control unit 1 is in a state with low current consumption. In this state, input 1b of control unit 1 is highly resistive.

If a current flows through lead 3 of the motor-vehicle accumulator battery, sensor element 7 emits a voltage which is amplified by second amplifier 5. If the voltage given off by second amplifier 5 exceeds the voltage applied at reference-voltage input 4a of comparator 4, comparator 4 emits a signal, whereby control unit 1 is activated. After the activation of control unit 1, the signal applied at input 1b may be processed in control unit 1.

If no current is flowing any longer in lead 3, no voltage is given off any longer by sensor element 7, which means the output signal of comparator 4 applied to activation input 1a of control unit 1 becomes zero. Control unit 1 thereby goes into a state with low current consumption.

What is claimed is:

1. A circuit configuration for monitoring a state of charge of a battery situated in a motor vehicle, the circuit configuration comprising:
   a control unit for recording and evaluating a flow of current out of or into the battery, the control unit being adapted to be shifted into a state with low current consumption, the control unit being further adapted to be brought out of the state with low current consumption by an activation signal; and
   a sensor for emitting a signal in response to a flow of current out of or into the battery, the sensor coupled to at least one primary winding of a transformer, the primary winding being coupled to a lead of the battery and being used to detect a flow of current in the lead.

2. The circuit configuration according to claim 1, wherein the state with low current consumption is a sleep mode.

3. The circuit configuration according to claim 1, wherein the primary winding is formed by the lead of the battery itself.

4. The circuit configuration according to claim 3, wherein the transformer is a component of a compensation-current sensor, by which the flow of current out of or into the battery is measured.

5. The circuit configuration according to claim 1, further comprising a comparator for receiving the sensor signal.

* * * * *